United States Patent
Sugiyama

(10) Patent No.: US 9,031,802 B2
(45) Date of Patent: May 12, 2015

(54) SMOOTH CURRENT CALCULATION APPARATUS, SMOOTH CURRENT CALCULATION METHOD AND BATTERY MONITORING MODULE

(75) Inventor: Ren Sugiyama, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 549 days.

(21) Appl. No.: 13/574,701

(22) PCT Filed: Jan. 19, 2011

(86) PCT No.: PCT/JP2011/050864
§ 371 (c)(1),
(2), (4) Date: Jul. 23, 2012

(87) PCT Pub. No.: WO2011/093189
PCT Pub. Date: Aug. 4, 2011

(65) Prior Publication Data
US 2012/0296587 A1    Nov. 22, 2012

(30) Foreign Application Priority Data

Jan. 29, 2010    (JP) ................. 2010-017843

(51) Int. Cl.
| | |
|---|---|
| G06F 19/00 | (2011.01) |
| G01R 31/36 | (2006.01) |
| G01R 19/25 | (2006.01) |
| G01R 19/165 | (2006.01) |

(52) U.S. Cl.
CPC ...... *G01R 31/3606* (2013.01); *G01R 19/16542* (2013.01); *G01R 19/2509* (2013.01); *G01R 31/3651* (2013.01)

(58) Field of Classification Search
CPC ....................................... H04B 1/12
USPC ...................................... 702/63, 64, 182–185
See application file for complete search history.

(56) References Cited

U.S. PATENT DOCUMENTS

| | | | |
|---|---|---|---|
| 5,192,918 A | 3/1993 | Sugiyama | |
| 2005/0213352 A1* | 9/2005 | Lys ................................. | 363/17 |
| 2007/0158945 A1* | 7/2007 | Annen et al. .................. | 290/1 A |
| 2008/0030198 A1 | 2/2008 | Kawata et al. | |
| 2009/0122931 A1 | 5/2009 | Hoshuyama | |

FOREIGN PATENT DOCUMENTS

| | | |
|---|---|---|
| JP | 05-075391 | 3/1993 |
| JP | 09-148862 | 6/1997 |

(Continued)

OTHER PUBLICATIONS

International Search Report mailed on Apr. 26, 2011.

*Primary Examiner* — Edward Raymond
(74) *Attorney, Agent, or Firm* — IPUSA, PLLC

(57) ABSTRACT

A smooth current calculation apparatus, which calculates a smooth current of a secondary battery, includes a digital low-pass filter (22~27) supplied with a measured digital current value generated by digitizing a measured current value of the secondary battery. The digital low-pass filter outputs a smooth digital current value, which is created by smoothing a time fluctuation of the measured digital current value. A current fluctuation level setting part (S1) compares a difference between the measured digital current value and the smooth digital current value with a threshold value, and sets a current fluctuation level based on a result of the comparison. A filter coefficient setting part (S2) sets a filter coefficient of the digital low-pass filter in accordance with the current fluctuation level.

9 Claims, 8 Drawing Sheets

(56) References Cited

FOREIGN PATENT DOCUMENTS

| JP | 10-014229 | 1/1998 |
| JP | 2004-150279 | 5/2004 |
| JP | 2008-039443 | 2/2008 |
| WO | WO 2007/010849 | 1/2007 |

* cited by examiner

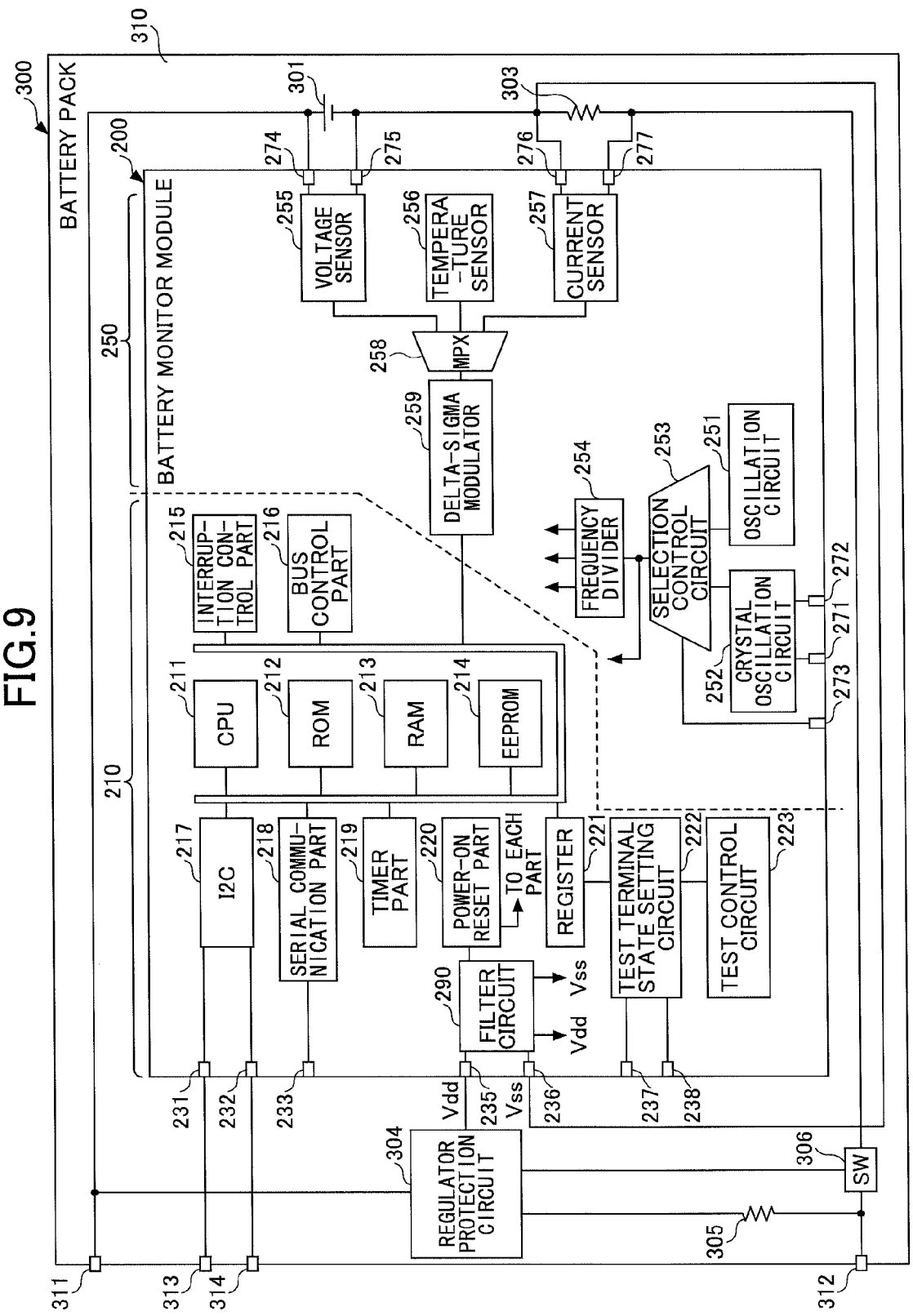

SMOOTH CURRENT CALCULATION APPARATUS, SMOOTH CURRENT CALCULATION METHOD AND BATTERY MONITORING MODULE

This application claims the benefit of PCT Application No. JP2011/050864, filed Jan. 19, 2011 and Japan Patent No. 2010-017843 filed Jan. 29, 2010, all of which are incorporated by reference in their entirety.

TECHNICAL FIELD

The present invention relates to a smooth current calculation apparatus and a smooth current calculation method, and a battery monitoring module using such an apparatus and a method.

BACKGROUND ART

In recent years, a battery pack using a secondary battery such as a lithium ion battery is mounted to a portable electronic device such as a cellular phone, a digital camera, etc. In a lithium ion battery, it is generally difficult to detect an amount of electric power remaining in the battery (hereinafter, referred to as a battery remaining amount) from a battery voltage. For this reason, in many cases, a battery remaining amount is measured by detecting a charge and discharge current of a battery and integrating the detected charge and discharge current.

In order to measure a battery remaining amount of a lithium ion battery according to the above-mentioned method, a battery monitoring module is provided to a battery pack in many cases. A semiconductor integrated circuit device constituting a battery monitoring module includes analog circuits such as a high-accuracy A/D conversion circuit, etc., and digital circuits such as a CPU and a timer for integrating measured current values.

FIG. 1 is a block diagram of an example of a current measurement apparatus in a battery monitoring module. In FIG. 1, a current analog value detected by a current sensor 10 is converted by a delta-sigma converter 11. The delta-sigma converted current value is digitized by being subject to a decimation filter process in a decimation filter processing part 12, and the digitized current value is stored in a RAM 13. Thereafter, a gain offset correction process is applied to the current value stored in the RAM 13 in the gain offset correction processing part 14.

Here, there is known a technique to reduce a current ripple upon reception of an output instruction current of a rectangular waveform (for example, refer to Patent Document 1). According to this technique, an LC value of an LC filter circuit is kept small by disconnecting a reactor when a current change rate of a pulse current output is large, and the LC value of the LC filter circuit is kept large by connecting the reactor when the current change rate of the pulse current output is small.

Moreover, there is suggested a technique to suppress a fluctuation in a steady state by filtering a given signal by an adaptive filter (for example, refer to Patent Document 2). According to this technique, a fluctuation state of the given signal is judged using a wavelet transform to set inner parameters of the adaptive filter in response to the judged fluctuation state.

PRIOR ART DOCUMENT

Patent Document

PATENT DOCUMENT 1: Japanese Laid-Open Patent Application No. 10-14229

PATENT DOCUMENT 2: Japanese Laid-Open Patent Application No. 2004-150279

SUMMARY OF THE INVENTION

Problems to be Solved by the Invention

In a battery pack mounted to a portable type electric device, a large fluctuation may occur in a measured current of a current measurement apparatus of a battery monitoring module depending on operating conditions of the device. In order to suppress such a fluctuation, it is considered to smooth the measure current using a low-pass filter in the current measurement apparatus.

In a case where an IIR (Infinite Impulse Response) filter having a fixed filter coefficient is used as a low-pass filter, a response of the filter can be caused to follow a large current fluctuation by setting a filter coefficient at which a response of the filter is quick. However, in a case where a filter coefficient at which the response of the filter is quick is set, a filter output may be non-constant but instead may fluctuate with respect to the waveform of the smooth current to be output.

On the other hand, by setting a filter coefficient at which a response of the filter is slow, a current value approximating an ideal smooth current value can be output after a long time period is passed from a start of the current waveform. However, a long time is needed until outputting a current value approximating the ideal smooth current value.

Moreover, in a case where a conventional adaptive filter using an LMS (Least Mean Square) algorithm or the like is used, a larger amount of input data values must be saved, which requires a large memory capacity. Accordingly, it is difficult to perform the LMS algorithm by a CPU in the battery monitoring module having limited resources.

The present invention was made in view of the above-mentioned points, and it is an object of the present invention to provide a smooth current calculation apparatus and smooth current calculation method that output an accurate and stable smooth current value in a short time, and a battery monitoring module using such an apparatus and a method.

Means to Solve the Problem

There is provided according to a mode for carrying out the invention a smooth current calculation apparatus configured to calculate a smooth current of a secondary battery, including: a digital low-pass filter supplied with a measured digital current value generated by digitizing a measured current value of the secondary battery and outputs a smooth digital current value, which is created by smoothing a time fluctuation of the measured digital current value; a current fluctuation level setting part that compares a difference between the measured digital current value and the smooth digital current value with a threshold value to set a current fluctuation level based on a result of the comparison; and a filter coefficient setting part that sets a filter coefficient of the digital low-pass filter in accordance with the current fluctuation level.

There is provided according to another mode for carrying out the invention a smooth current calculation method for calculating a smooth current of a secondary battery, including: outputting a smooth digital current value by smoothing a time fluctuation of a measured digital current value, which is created by digitizing a measured current value of the secondary battery; comparing a difference between the measured digital current value and the smooth digital current value with a threshold value, and setting a current fluctuation level based on a result of the comparison; and setting a filter coefficient of a digital low-pass filter in accordance with the current fluctuation level.

There is provided a further mode for carrying out the invention a battery monitoring module, comprising: the above-mentioned smooth current calculation apparatus, wherein a remaining operable time is calculated by dividing an electric power amount acquired by integrating the measured digital current value of the secondary battery by the smooth digital current value.

Effect of the Invention

According to the present invention, an accurate and stable smooth current value can be output in a short time.

BRIEF DESCRIPTION OF DRAWINGS

FIG. 9 is a block diagram of a battery pack having a battery monitoring module according to an embodiment of the present invention.

MODE FOR CARRYING OUT THE INVENTION

A description will be given below of an embodiment of the present invention based on the drawings.

<Embodiment of Smooth Current Calculation Device>

Figure 1:
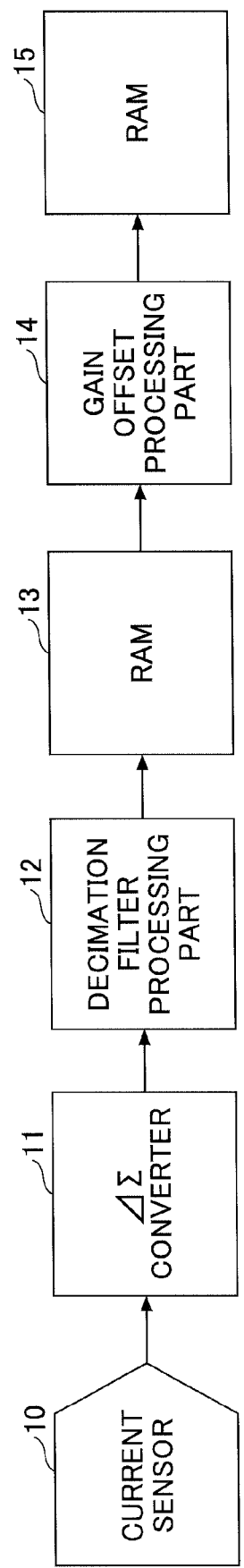
FIG. 1 is a block diagram of an example of a conventional current measurement apparatus.
Figure 2:
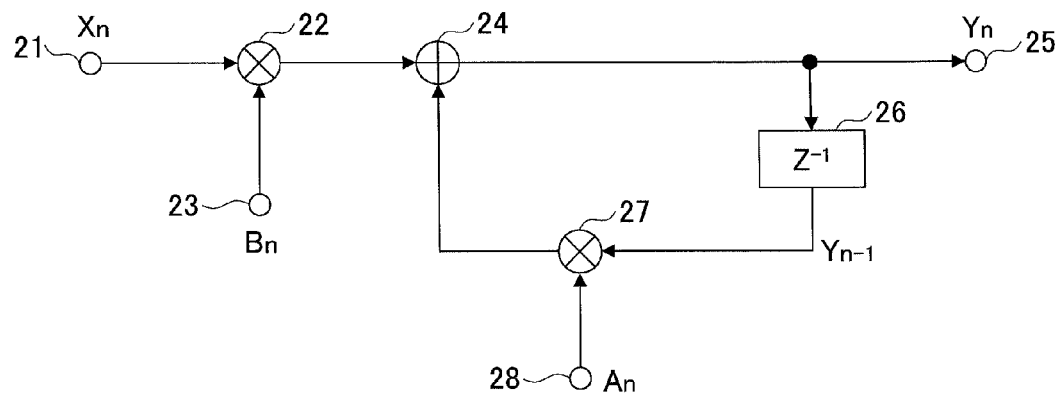
FIG. 2 is a circuit structure diagram of a digital low-pass filter circuit used in a smooth current calculation device according an embodiment of the present invention.

FIG. 2 is a circuit structure diagram of a digital low-pass filter circuit used in a smooth current calculation apparatus according to an embodiment of the present invention. In FIG. 2, a current value $X_n$, which is a digital value read from a memory (a RAM 213 mentioned later), is input to a terminal 21, and the input current value $X_n$ is supplied to a multiplier 22. A first filter coefficient $B_n$ is supplied to the multiplier 22 from a terminal 23. The multiplier multiplies the current value $X_n$ by the filter coefficient $B_n$, and supplies the multiplied value to an adder 24. The adder 24 adds a multiplied value, which is supplied from a multiplier 27 mentioned later, to the multiplied value supplied from the multiplier 22.

The smooth value $Y_n$ output by the adder 24 is output from a terminal 25, and is delayed by a unit time by a unit delay element 26 to be a delayed smooth value $Y_{n-1}$ and supplied to a multiplier 27. A second filter coefficient $A_n$ is supplied to the multiplier from the terminal 23. The multiplier 27 multiplies the delayed smooth value $Y_{n-1}$ by the filter coefficient $A_n$, and supplies the multiplied value to the adder 24.

That is, the smooth value $Y_n$, which is expressed by $Y_n = N_n \times B_n + Y_{n-1} \times A_n$, is output from the adder 24, and is stored in a memory (a RAM 213 mentioned later). Here, in the present embodiment, it is set that $B_n + A_n = 1$. In addition, although FIG. 2 illustrates the digital low-pass filter circuit, the circuit operation of FIG. 2 may be performed by a software process by a processing device such as a CPU or the like.

<Flowchart of Filter Coefficient Setting Process>

Figure 3:
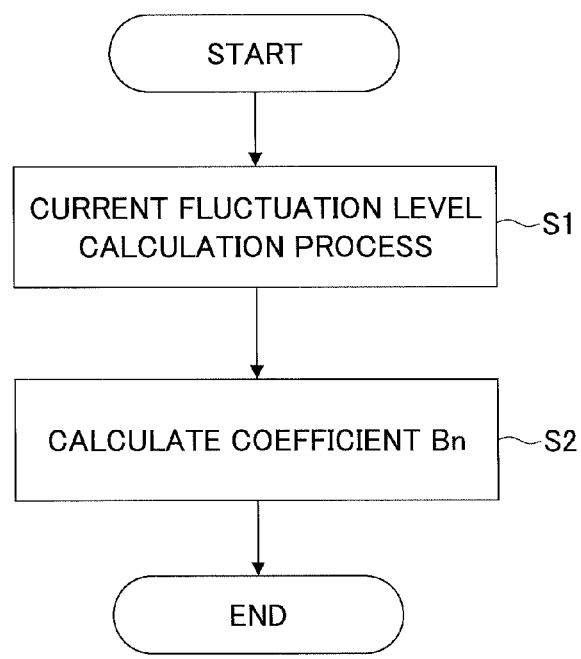
FIG. 3 is a flowchart of a filter coefficient setting process which the smooth current calculation device executes at a predetermined cycle.

FIG. 3 is a flowchart of a filter coefficient setting process, which a smooth-current calculation apparatus performs at a predetermined cycle. In FIG. 3, the filter coefficient setting process includes a current fluctuation level calculation process of step S1 and a filter coefficient calculation process of step S2. The filter coefficient setting process of FIG. 3 is repeatedly performed at a predetermined cycle (for example, a period of a degree from a few tens milliseconds to a few seconds).

Figure 4:
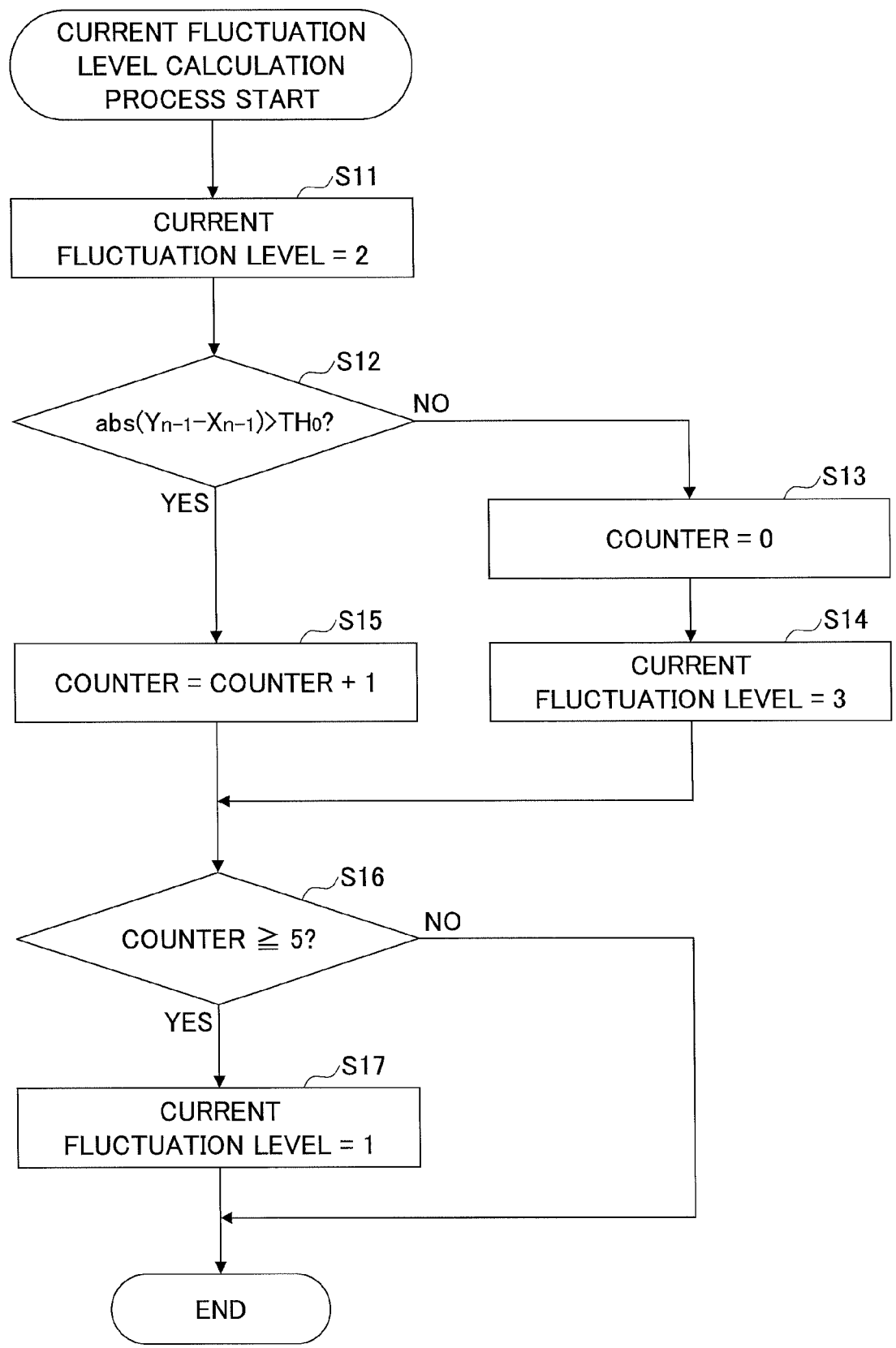
FIG. 4 is a flowchart of a current fluctuation level calculation process.

FIG. 4 is a flowchart of the current fluctuation level calculation process performed in step S1. In the present embodiment, the current fluctuation level is classified into three stages. A current fluctuation level=1 represents a large fluctuation, a current fluctuation level=2 represents a small fluctuation, and a current fluctuation level=3 represents no fluctuation.

In FIG. 4, the current fluctuation level=2 is set in step S11. Then, it is determined, in step S12, whether an absolute vale $abs(X_{n-1} - Y_{n-1})$ of a difference between a current value $X_{n-1}$ of the last time and a smooth value $Y_{n-1}$ of the last time exceeds a threshold value TH0. Then, if $abs(X_{n-1} - Y_{n-1}) \leq TH0$, a value of a counter is reset to zero in step S13, and the current fluctuation level=3 is set in step S14. Here, the threshold value TH0 can be acquired according to the following expression (1). It should be noted that, in the expression (1), for example, gain=0.2, and, for example, offset=6.

$$TH0 = \text{gain} \times Y_{n-1} + \text{offset} \tag{1}$$

On the other hand, if $abs(X_{n-1} - Y_{n-1}) > TH0$, the value of the counter is incremented by 1 in step S15, and, thereafter, it is determined in step S16 whether the value of the counter is equal to or greater than 5. If the value of the counter is smaller than 5, this process is ended. If the value of the counter is equal to or greater than 5, the current fluctuation level=1 is set in step S17, and the process is ended. Thus, if $abs(X_{n-1} - Y_{n-1}) > TH0$ and if the value of the counter is smaller than 5, the current fluctuation level=2 is set.

Figure 5A:
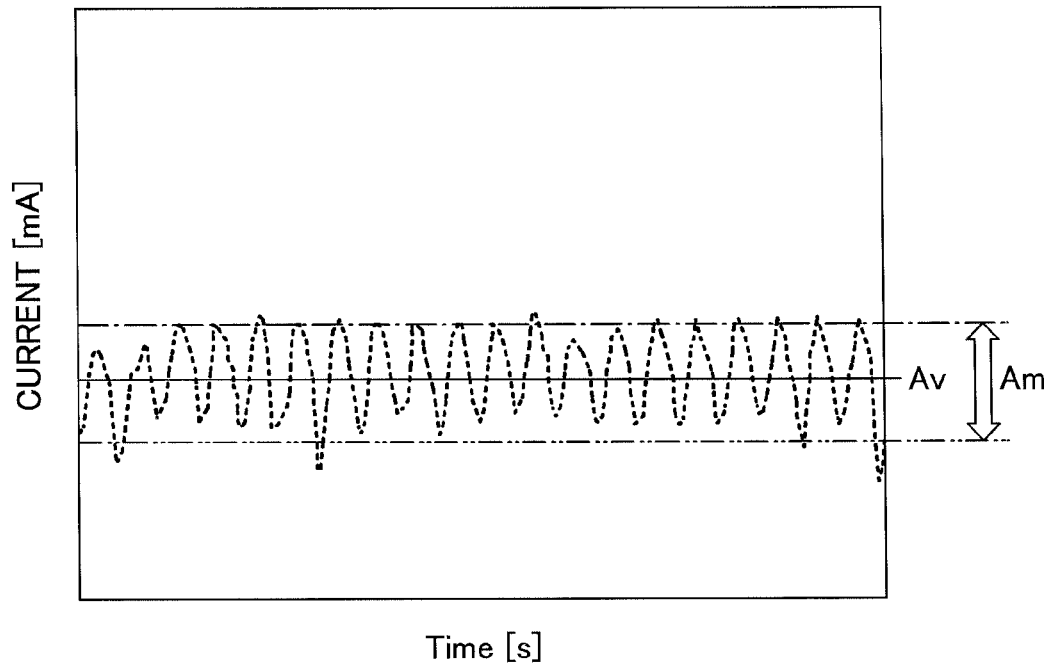
FIG. 5A is a graph indicating a fluctuation width (amplitude) of a current.

A description is given of a calculation method of the gain coefficient "gain" and the offset coefficient "offset" of the above-mentioned expression (1). FIG. 5A is a graph indicating a waveform of a measured current value by dotted lines. An ideal average current value Av is an average value of measured current values. A current fluctuation width Am is a difference between a local maximum value envelope (single-dashed chain line) and a local minimum value envelope (double-dashed chain line) of the measured current values during a predetermined time period.

Figure 5B:
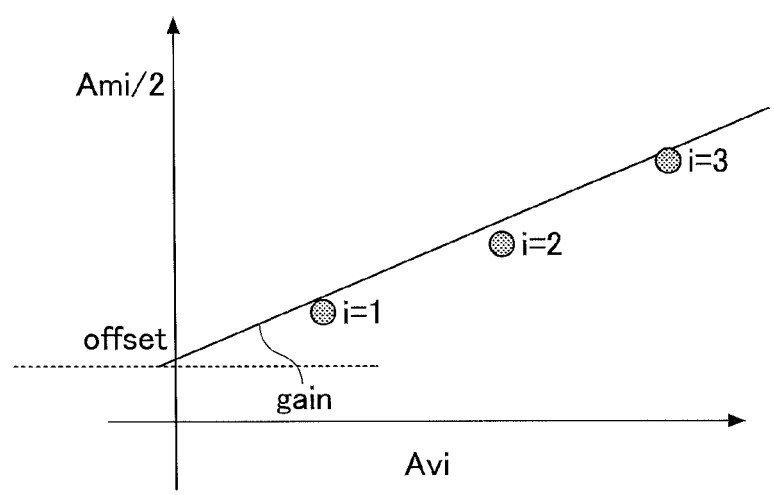
FIG. 5B is a graph indicating a relationship between a smooth value and an amplitude of a current.

In this case, the ideal average current value Avi of measured current values $X_i$ (i=1, 2, 3, ...) to output a smooth value and a current fluctuation width Ami which is acquired by pulse-like noise components from the measured current value $X_i$ are on a direct function (straight line) such as illustrated in FIG. 5B. In the example illustrated in FIG. 5B, 0.2 is set as a gain, which is an inclination of the direct function (straight line), and offset=6 is set.

Figure 6:
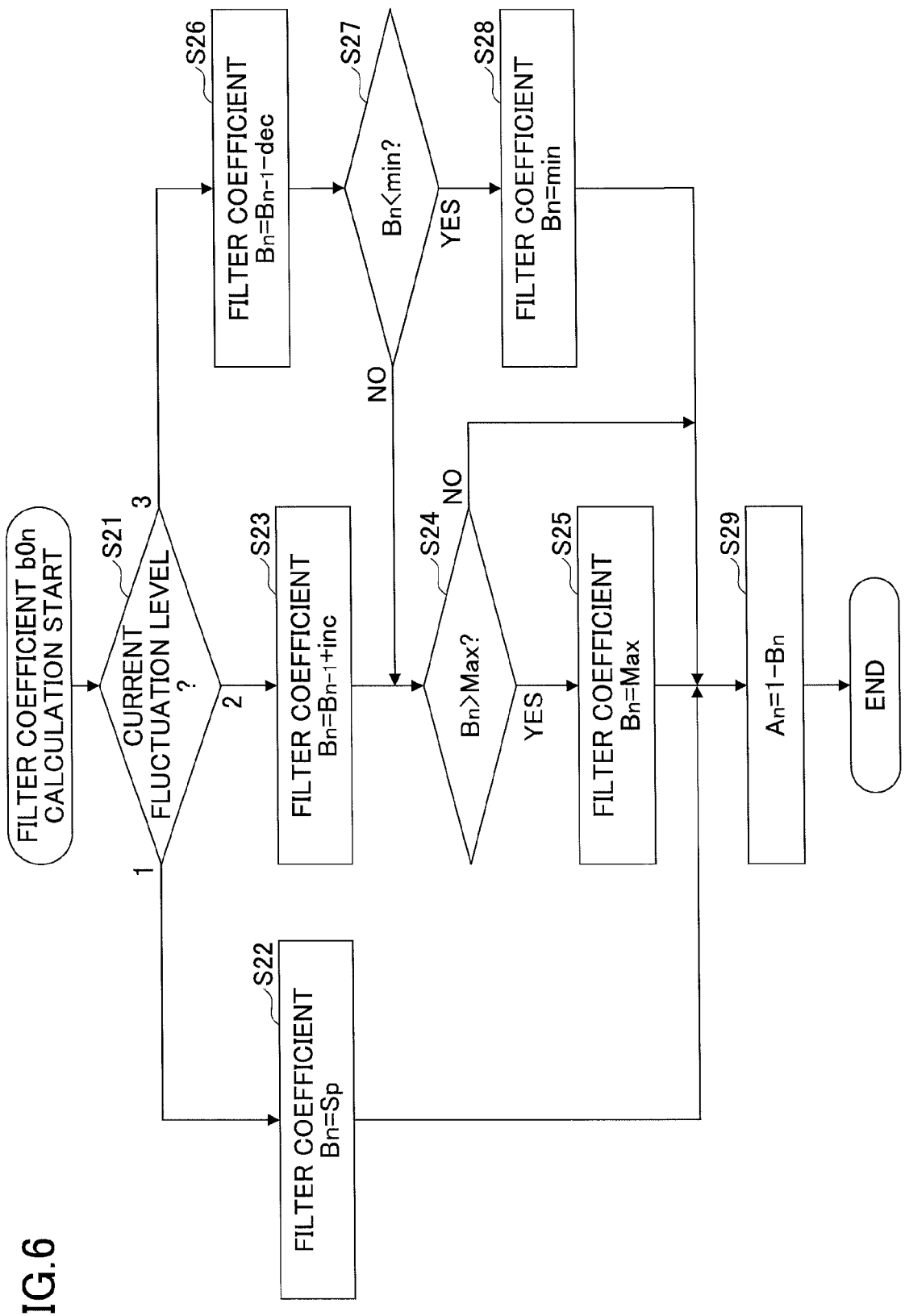
FIG. 6 is a flowchart of a filter coefficient calculation process.

FIG. 6 is a flowchart of the filter coefficient calculation process performed in step S2. In FIG. 6, it is determined in step S21 whether the current fluctuation level is one of 1, 2 and 3. If the current fluctuation level is 1, the filter coefficient $B_n$ of the present time is set to $S_p$ in step S29. Then, $(1-B_n)$ is set to the filter coefficient An of this time in step S29, and the process is ended.

If the current fluctuation level is 2 in step S21, the filter coefficient $B_n$ at this time is incremented, in step S23, by an increment value "inc" from the filter coefficient $B_{n-1}$ of the last time. Then, it is determined in step S24 whether the filter coefficient $B_n$ at this time exceeds a maximum value "Max", and only when $B_n$>Max, the maximum value "Max" is set, in step S29, to the filter coefficient $B_n$ at this time. Then, $(1-B_n)$ is set, in step S29, to the filter coefficient $A_n$ at this time, and the process is ended.

If the current fluctuation level is 3 in step S21, the filter coefficient $B_n$ at this time is decremented, in step S26, by a decrement value "dec" from the filter coefficient $B_{n-1}$ of the last time. Then, it is determined in step S27 whether the filter coefficient $B_n$ at this time is smaller than a minimum min. If $B_n$<min, the minimum value "min" is set, in step S28, to the filter coefficient Bn. If not $B_n$<min, it is determined in step S24 whether the filter coefficient $B_n$ at this time exceeds the maximum value "Max". Only when $B_n$>Max, the maximum value "Max" is set, in step S25, to the filter coefficient $B_n$ at this time. Then, $(1-B_n)$ is set, in step S29, to the filter coefficient $A_n$ at this time, and the process is ended.

Here, in the present embodiment, for example, $S_p$=0.54, Max=0.18, min=0.007, inc=0.004, and dec=0.012.

Figure 7:
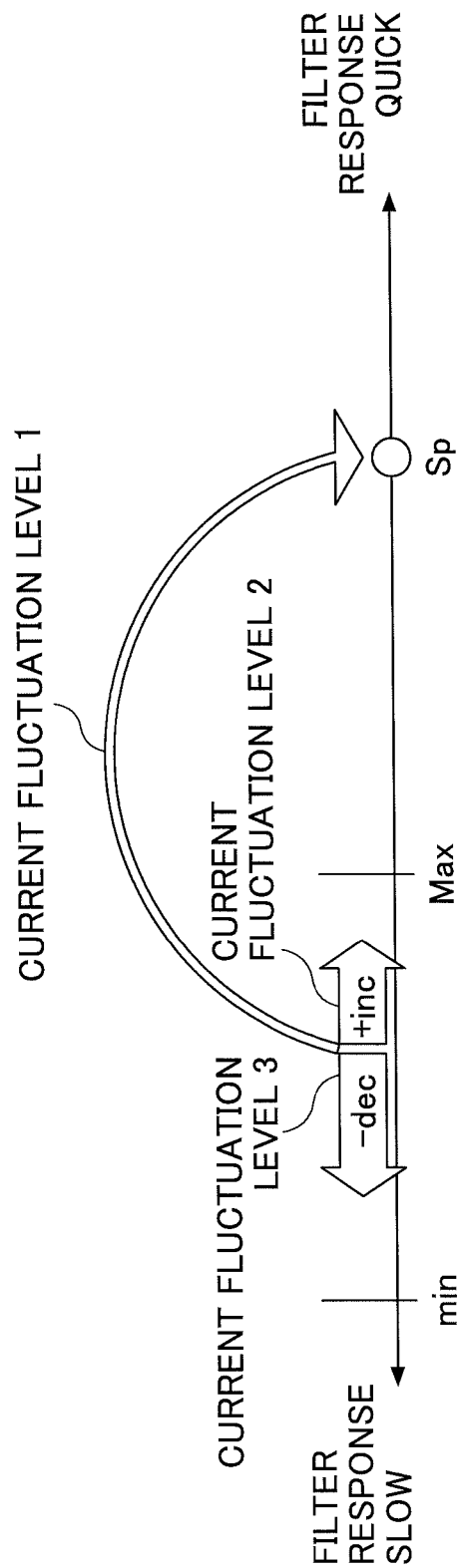
FIG. 7 is an illustration indicating a change in a filter coefficient $B_n$ according to a current fluctuation level.

FIG. 7 is an illustration indicating changes in the filter coefficient $B_n$ according to the current fluctuation level. In FIG. 7, if there is a large fluctuation when the current fluctuation level is 1, the filter coefficient $B_n$ is set to $S_p$ in order to increase a weight to the current value $X_n$ at this time at once. When the current fluctuation level is 2 and there is a fluctuation, the filter coefficient $B_n$ is increased by a small amount in order to increase the weight to the current value $X_n$ at this time. In this case, the filter coefficient $B_n$ is increased so that the filter coefficient $B_n$ does not exceed the maximum value "Max". Additionally, when the current fluctuation level is 3 and there is no fluctuation, the filter coefficient $B_n$ is decreased by a small amount in order to slightly decrease the weight to the current value $X_n$ at this time. In this case, the filter coefficient $B_n$ is decreased so that the filter coefficient $B_n$ does not go down below the minimum value "min".

That is, the filter coefficient $B_n$, which is a filter coefficient of a low-pass filter, is set to a value within a variable range ("min"~"Max") at which a response is slow when the current fluctuation is relatively small, and if there is a large fluctuation, it is set to the value $S_p$ at which a response is very quick.

When changing the filter coefficient $B_n$ within the variable range ("min"~"Max"), the code size of the increase "inc" and the decrease "dec" can be reduced by using addition and subtraction. Additionally, the decrease "dec" to slow the response of the filter is set to a value larger than the increase "inc" to cause the filter to respond quick. This is to delay the response at a shorter time as a probability of abs($X_{n-1}-Y_{n-1}$) becoming larger than TH0 based on a result of comparison between abs ($X_{n-1}-Y_{n-1}$) and TH0. However, if the decrease "dec" is excessively larger than the increase "inc", the output value may converge to a value which is not a true smooth value.

<Waveform Chart>

Figure 8:
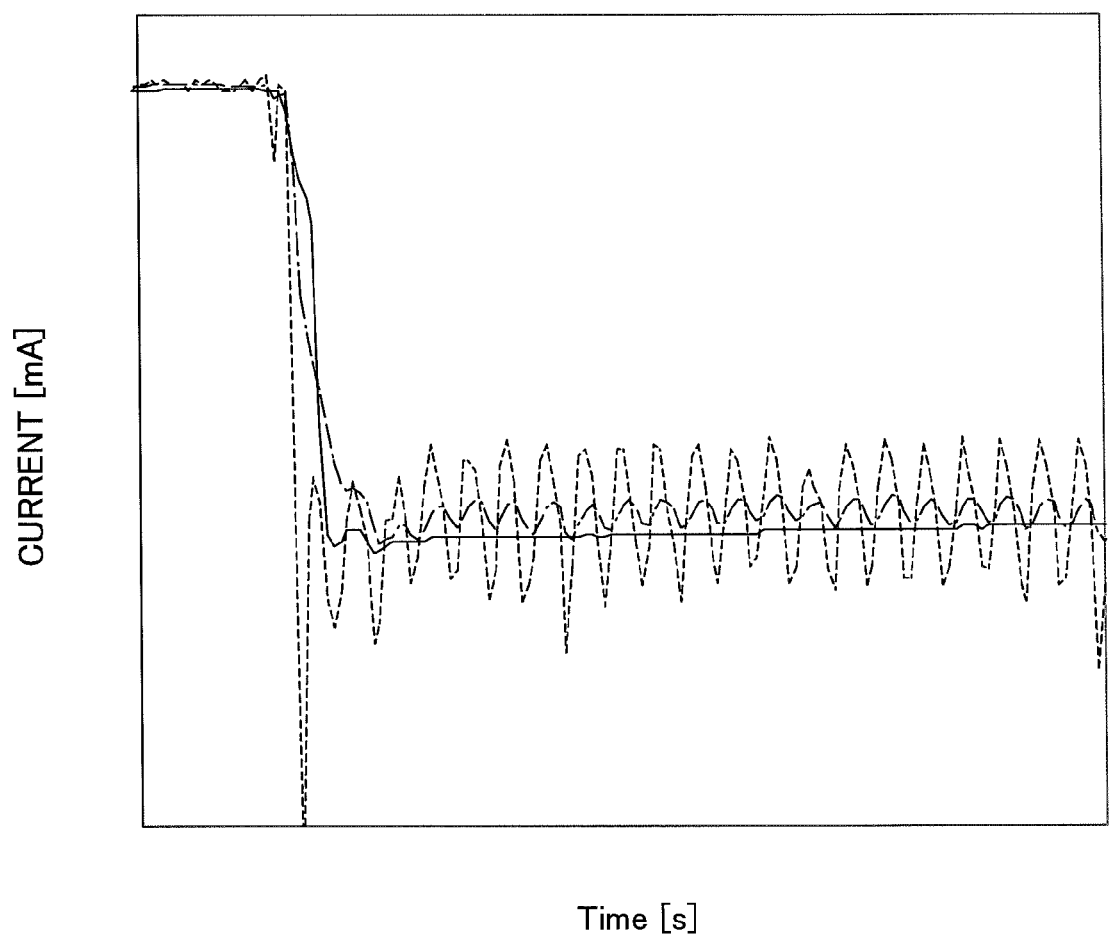
FIG. 8 is a graph indicating changes in a measurement current and a smooth current.

FIG. 8 is a graph indicating changes in a measured current and a smooth current. In FIG. 8, a dashed line indicates the measure current, and a solid line indicates the smooth current. In the smooth current calculation apparatus according to the present embodiment, the smooth current as indicated by a solid line can be acquired with respect to the measured current indicated by the dashed line. It should be noted that a smooth current of a case where an IIR filter of which filter coefficient ($B_n$) is a fixed value (=0.18) is used is indicated by a single-dashed chain line for the sake of comparison. Thus, according to the present embodiment, the smooth current in which a large fluctuation of the measured current is sufficiently smoothed can be obtained.

In the meantime, in a battery pack, a battery remaining amount is calculated by integrating the charge and discharge current (measured currents) of the battery. Further, a remaining operable time is calculated by dividing the battery remaining amount by the smooth current.

<Battery Pack>

FIG. 9 is a block diagram of a battery pack having a battery monitoring module according to an embodiment of the present invention. In FIG. 9, the battery monitoring module 200 includes a digital part 210 and an analog part 250.

The digital part 210 is provided with a CPU 211, a ROM 212, a RAM 213, an EEPROM 214, an interruption control part 215, a bus control part 216, an I2C part 217, a serial communication part 218, a timer part 219, a power-on reset part 220, a register 221, a test terminal state setting circuit 222, a test control circuit 223, and a filter circuit 290. The CPU 211, the ROM 212, the RAM 213, the EEPROM 214, the interruption control part 215, the bus control part 216, the I2C part 217, the serial communication part 218, the timer part 219, and the register 221 are mutually connected by an internal bus.

The CPU 211 executes a program stored in the ROM 212 to control the entire battery monitoring module 200. Moreover, the CPU 211 performs the filter coefficient setting process illustrated in FIG. 3 to FIG. 5, and the low-pass filter process to acquire the smooth value Yn of FIG. 2. Further, the CPU 211 performs a process of calculating a battery remaining amount by integrating the charge and discharge current (measured current) of the battery, and a process of calculating a remaining operable time by dividing a remaining battery amount by a smooth current value. In this case, the RAM 213 is used as a work area. Trimming information, etc. is stored in the EEPROM 214.

The interruption control part 215 generates interruption according to a priority of an interruption request supplied from each part of the battery monitoring module 200, and sends a notification to the CPU 211. The bus control part 216 controls which circuit part uses the internal bus.

The I2C part 217 is connected to a communication line via ports 231 and 232 to perform serial communication of a two-wire system through the communication line. The serial communication part 218 is connected to a communication line, which is not illustrated, through a port 233 to perform serial communication of a single-wire system.

The timer part 219 counts a system clock and the count value is referred to by the CPU 211. The power-on reset part 220 detects a raise of a power supply Vdd supplied to a port 235 connected through the filter circuit 290 to generate a reset signal, and supplies the reset signal to each part of the battery monitoring module 200.

Information from the EEPROM 214 is transferred to the register 221. The test terminal state setting circuit 222 connects between test terminals 237 and 238 and the test control circuits 223 according to the information retained in the register 221. Moreover, the test terminal state setting circuit 222 sets an input of the test control circuit 223 corresponding to the test ports 237 and 238 to a predetermined level.

The test control circuit 223 changes a state of an internal circuit according to the input to the test ports 237 and 238. Thereby, it becomes possible to test the internal circuit of the battery monitoring module 200.

The analog part 250 is provided with an oscillation circuit 251, a crystal oscillation circuit 252, a selection control circuit 253, a frequency divider 254, a voltage sensor 255, a temperature sensor 256, a current sensor 257, a multiplexer (MPX) 258, and a delta-sigma modulator 259.

The oscillation circuit 251 is an oscillator including a PLL circuit to output an oscillation signal of a few MHz. The crystal oscillation circuit 252 generates and outputs a few MHz oscillation signal using the quartz resonator attached to ports 271 and 272. The oscillation frequency of the crystal oscillation circuit 252 is more accurate than the oscillation frequency of the oscillation circuit 251.

The selection control circuit 253 selects an oscillation frequency signal which one of the oscillation circuit 251 and the crystal oscillation circuit 252 outputs based on a selection signal supplied from a port 273. The selection control circuit 253 supplies the selected oscillation signal as a system clock to each part of the battery monitoring module 200 and the frequency divider 254. The selection control circuit 253 generates a reset signal RST and a control signal CNT. The selection control circuit 253 selects the oscillation signal which, for example, the oscillation circuit 251 outputs, when the selection signal is not supplied from the port 273. The frequency divider divides the system clock to generate various kinds of clock signals, and supplies the generated clock signals to each part of the battery monitoring module 200.

The voltage sensor 255 detects a voltage of a lithium ion battery 301 connected to ports 274 and 275, and supplies an analog value of the detected voltage to the multiplexer 258. The temperature sensor 256 detects an environmental temperature of the battery monitoring module 200, and supplies an analog value of the detected temperature to the multiplexer 258.

Both terminals of a resistor 303 for current detection are connected to ports 276 and 277. The current sensor 257 detects a current flowing through the resistor 303 from a potential difference between the ports 276 and 277, and supplies an analog value of the detected current to the multiplexer 258.

The multiplexer 258 sequentially selects the analog value of the detection voltage, the analog value of the detected temperature and the analog value of the detected current, and supplies them to the delta-sigma modulator 259. The delta-sigma modulator 259 applies a delta-sigma conversion on each analog value, and supplies pulse density modulation data to the CPU 211 through the internal bus. The CPU 211 applies a digital filter process to the pulse density modulation data to change the analog value of the detected voltage, the analog value of the detected temperature and the analog value of the detected current to digital values. Moreover, the CPU 211 calculates a battery remaining amount by integrating the charge and discharge current of the battery. In this case, the detected temperature is used for a temperature correction.

The above-mentioned battery monitoring module 200 is accommodated in a housing 310 together with the lithium ion battery 301, the resistor 303 for current detection, a regulator protection circuit 304, a resistor 305 and a switch 306 so that a battery pack 300 is constituted. A positive electrode of the lithium ion battery 301 and a power supply input terminal of the regulator protection circuit 304 are connected to a terminal 311 of the battery pack 300. A power supply output terminal of the regulator protection circuit 304 is connected to a port 235 of a power supply Vdd of the battery monitoring module 200. A terminal 312 is connected to a grounding terminal of the regulator protection circuit 304 through the resistor 305, and also connected to a connection point between the resistor 303 for current detection and a port 277 though the switch 306. The regulator protection circuit 304 stabilizes a voltage between the terminals 311 and 312, and turns off the switch 306, when the voltage is out of a predetermined range, to protect the battery monitoring module 200.

Moreover, a port 236 of a power supply Vss of the battery monitoring module 200 is connected to a connection point between the resistor 303 for current detection and a port 276. Ports 231 and 232 of the battery monitoring module 200 are connected to the terminals 313 and 314 of the battery pack 300, respectively.

The present invention is not limited to the specifically disclosed embodiments, and various variations and modifications may be made without departing from the scope of the present invention.

The present application is based on priority claimed Japanese Patent Application No. 2010-017843 filed on Jan. 29, 2010, the entire contents of which are incorporated herein by reference.

EXPLANATION OF REFERENCE NUMERALS 21, 25 terminal
22, 27 multiplier
24 adder
200 battery monitoring module
211 CPU
213 RAM
259 delta-sigma modulator
255 voltage sensor
256 temperature sensor
257 current sensor
300 battery pack
301 lithium ion battery

The invention claimed is:

1. A smooth current calculation apparatus configured to calculate a smooth current of a secondary battery, comprising:
   a digital low-pass filter supplied with a measured digital current value generated by digitizing a measured current value of the secondary battery and outputs a smooth digital current value, which is created by smoothing a time fluctuation of said measured digital current value;
   a current fluctuation level setting part that compares a difference between said measured digital current value and said smooth digital current value with a threshold value to set a current fluctuation level based on a result of the comparison; and
   a filter coefficient setting part that sets a filter coefficient of said digital low-pass filter in accordance with said current fluctuation level.

2. The smooth current calculation apparatus as claimed in claim 1, wherein
   said digital low-pass filter includes:
   a first multiplier that multiplies said measured digital current value by a first filter coefficient;
   a second multiplier that multiplies a digital current value, which is generated by delaying said smooth digital current value by a unit delay time, by a second filter coefficient; and
   an adder that outputs as said smooth digital current value a value acquired by adding an output value of said second multiplier to an output value of said first multiplier, and
   wherein a sum of said first filter coefficient and said second filter coefficient is a fixed value.

3. The smooth current calculation apparatus as claimed in claim 2, wherein said current fluctuation setting part sets a first current fluctuation level when a state where said difference exceeds said threshold value continues for a predetermined time; sets a second current fluctuation level when the state where said difference exceeds said threshold value does not continue for said predetermined time; and sets a third current fluctuation level when a state where said difference is smaller than said threshold value continues, and wherein said filter coefficient setting part sets a fixed value exceeding a predetermined range to said first filter coefficient when said first current fluctuation level is set; sets said first coefficient by increasing within said predetermined range when said second current fluctuation level is set; and sets said first filter coefficient by decreasing within said predetermined range when said third current fluctuation level is set.

4. The smooth current calculation apparatus as claimed in claim 3, wherein said threshold value is changed in accordance with a digital current value, which is generated by delaying said smooth digital current value by said unit delay time.

5. A battery monitoring module, comprising:
the smooth current calculation apparatus as claimed in claim 4,
wherein a remaining operable time is calculated by dividing an electric power amount acquired by integrating said measured digital current value of said secondary battery by said smooth digital current value.

6. A smooth current calculation method for calculating a smooth current of a secondary battery, comprising:
outputting a smooth digital current value by smoothing a time fluctuation of a measured digital current value, which is created by digitizing a measured current value of the secondary battery;
comparing a difference between said measured digital current value and said smooth digital current value with a threshold value, and setting a current fluctuation level based on a result of the comparison; and setting a filter coefficient of a digital low-pass filter in accordance with said current fluctuation level.

7. The smooth current calculation method as claimed in claim 6, including:
acquiring a first output value by multiplying said measured digital current value by a first filter coefficient;
acquiring a second output value by multiplying a digital current value, which is generated by delaying said smooth digital current value by a unit delay time, by a second filter coefficient; and
outputting as said smooth digital current value a value acquired by adding said second output value to said first output value,
wherein a sum of said first filter coefficient and said second filter coefficient is a fixed value.

8. The smooth current calculation method as claimed in claim 7, wherein
in setting said current fluctuation level, setting a first current fluctuation level when a state where said difference exceeds said threshold value continues for a predetermined time; setting a second current fluctuation level when the state where said difference exceeds said threshold value does not continue for said predetermined time; and setting a third current fluctuation level when a state where said difference is smaller than said threshold value continues, and wherein,
in setting said filter coefficient, setting a fixed value exceeding a predetermined range to said first filter coefficient when said first current fluctuation level is set; setting said first coefficient by increasing within said predetermined range when said second current fluctuation level is set; and setting said first filter coefficient by decreasing within said predetermined range when said third current fluctuation level is set.

9. The smooth current calculation method as claimed in claim 8, wherein said threshold value is changed in accordance with a digital current value, which is generated by delaying said smooth digital current value by said unit delay time.

* * * * *